United States Patent [19]
Gluss et al.

[11] Patent Number: 5,517,658
[45] Date of Patent: May 14, 1996

[54] METHOD FOR TESTING DESIGN TIMING PARAMETERS USING A TIMING SHELL GENERATOR

[75] Inventors: David Gluss, Woodside; Georgia Lazana, Mountain View; Douglas Boyle, Palo Alto, all of Calif.

[73] Assignee: LSI Logic Corporation, Milpitas, Calif.

[21] Appl. No.: 238,597

[22] Filed: May 4, 1994

Related U.S. Application Data

[63] Continuation of Ser. No. 611,019, Nov. 9, 1990, abandoned.

[51] Int. Cl.⁶ ............................................. G06F 15/60
[52] U.S. Cl. ...................... 395/800; 395/700; 395/500; 364/578; 364/232.3; 364/264.3; 364/265; 364/DIG. 1
[58] Field of Search ........................... 395/800, 700, 395/500; 364/578, 232.3, 264.3, 265, 578, DIG. 1

[56] References Cited

U.S. PATENT DOCUMENTS

| | | | |
|---|---|---|---|
| 4,924,430 | 5/1990 | Zasio et al. | 364/578 |
| 5,095,454 | 3/1992 | Huang | 364/578 |
| 5,105,374 | 4/1992 | Yoshida | 364/578 |
| 5,111,413 | 5/1992 | Lazansky et al. | 364/578 |

*Primary Examiner*—Alyssa H. Bowler
*Assistant Examiner*—John Harrity
*Attorney, Agent, or Firm*—Claude A. S. Hamrick; Emil C. Chang

[57] ABSTRACT

A method for testing the timing parameters of a system design is presented, especially suited for use in testing for timing violations between the pins of a semiconductor device. A description of the timing constraints of the various modules of a design is written in a common non-technical vernacular, and functions as an input file. A Timing Shell Generator converts the input file description into a simulator-environment-compatible output code-language file description. The output code-language file is operative to implement the timing constraints of the original input file during simulation such that any violations of the prescribed timing constraints are indicated to the tester who can then take appropriate action.

4 Claims, 2 Drawing Sheets

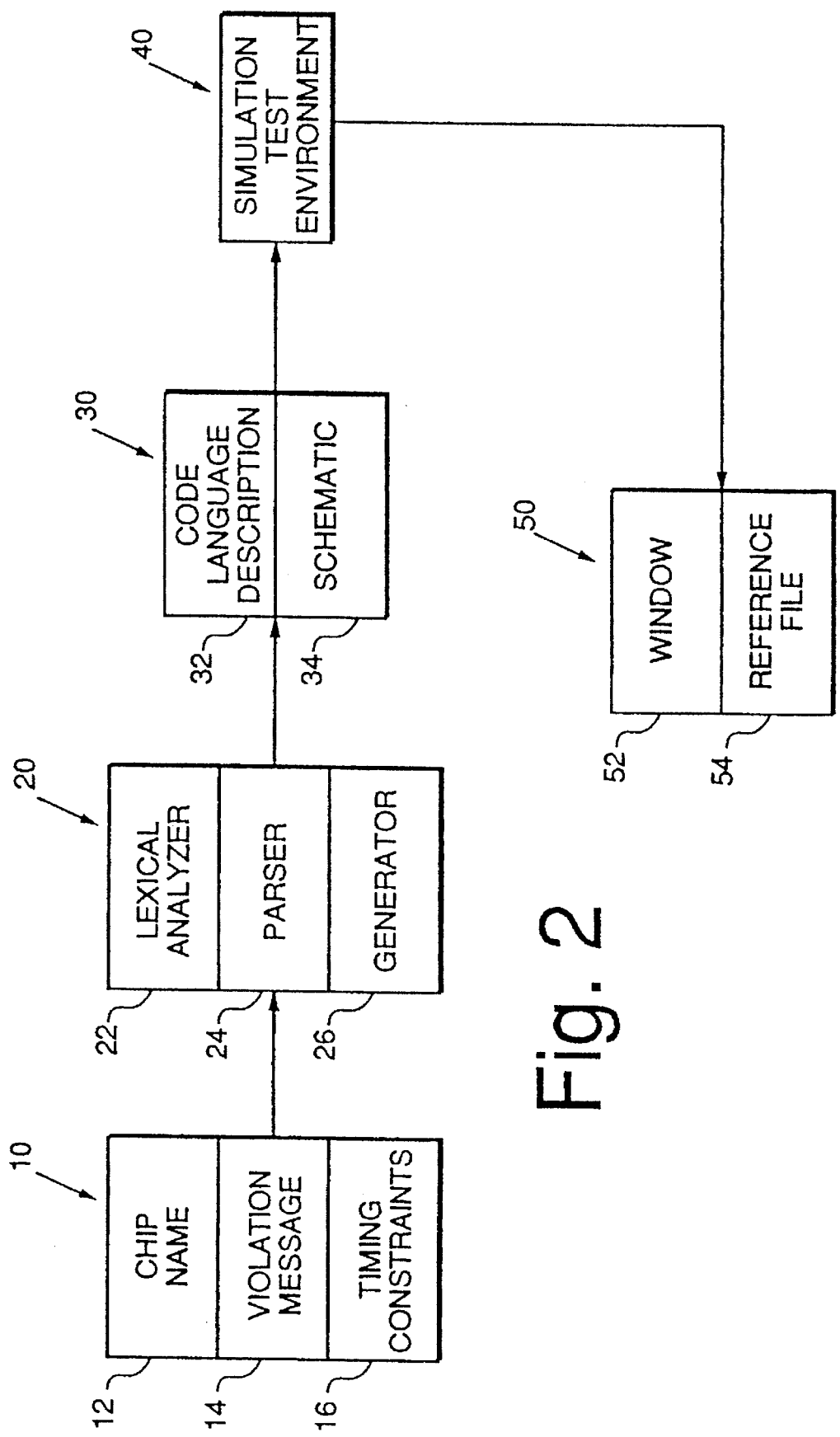

METHOD FOR TESTING DESIGN TIMING PARAMETERS USING A TIMING SHELL GENERATOR

This is a continuation of application Ser. No. 07/611,019 filed on Nov. 9, 1990, now abandoned.

BACKGROUND OF THE INVENTION

1. Field of the Invention

The present invention relates generally to methods used for testing the timing parameters of a system design, and more specifically to a method of utilizing a Timing Shell Generator Program to monitor timing violations between the modules of a design during an event driven simulation.

2. Brief Description of the Prior Art

With the complexity of modern circuits and system designs, it is often impossible or impractical to check for timing violations between the various blocks of a hardware design with an acceptable degree of accuracy. There are often several thousand individual gates incorporated into a design, all of which must interact within predetermined time periods to facilitate the precision necessary to accommodate a functional circuit or system. This often presents formidable design problems which require an inordinate amount of applications support.

SUMMARY OF THE INVENTION

It is, therefore, an object of the present invention to provide a method which enables a hardware designer to check for timing violations between the modules of a design without a significant degree of applications support.

It is another object of the present invention to provide a method of the type described wherein timing violations between the modules of a design can be monitored in real time in an Event Driven Simulation Environment.

It is another object of the present invention to provide a method of the type described wherein an "English-like" language can be used to specify the timing constraints of a module, thus greatly facilitating the simplicity of using the method in various environments.

It is a further object of the present invention to provide a method of the type described which can be used in checking the timing constraints of any block or sub-block of a design, at the system level, chip level, or functional block level.

It is a still further object of the present invention to provide a method of the type described wherein an informational message is relayed to a user if a violation of any constraint is detected, thus giving the user the option of continuing or quitting the simulation.

These and other objects are achieved using the method of the present invention whereby a user first writes a description of the various timing constraints of a module using a common vernacular. This description functions as an input file which is fed into the object code of a Timing Shell Generator Program. The Timing Shell Generator comprises a lexical analyzer, parser and generator, and is operative to produce a behavioral simulation language output file which implements the timing constraints of the original input file during a simulation. This is achieved by linking the behavioral simulation language output file with an appropriate logic simulator whereby the timing shell is thereafter capable of monitoring all of the defined pins, checking for timing violations. In the case of a violation, a message is relayed to the user describing the violation location, time and type, whereafter the user can ignore the violation and continue the simulation, or alternatively can quit the simulation.

IN THE DRAWING

FIG. 2 is a block diagram illustrating the specific components of the diagram of FIG. 1.

DETAILED DESCRIPTION OF THE PREFERRED EMBODIMENT

Figure 1:
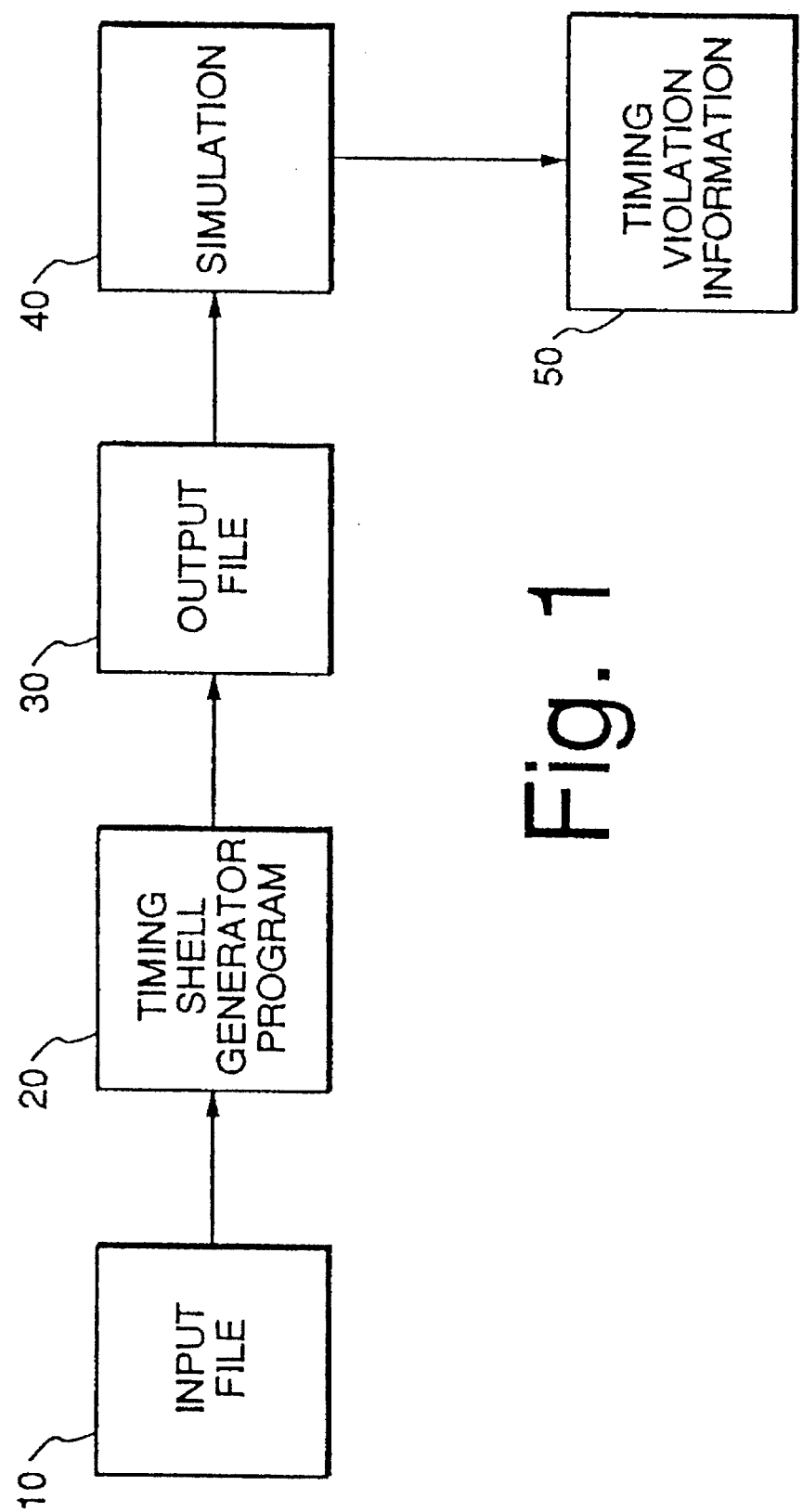
FIG. 1 is a simplified block diagram illustrating the general method of the present invention.

Referring now to FIG. 1, shown are the generalized steps and sequence comprising the method of the present invention. The most common application of the present method involves monitoring predesignated pins of a chip design for timing violations in accordance with a range of values assigned to each pin. Although normally used in an Event Driven Simulation Environment, the method of the present invention could also be used in a tester environment or any other appropriate environment.

As illustrated in FIG. 1, a user, for example, a designer with a new chip design, creates an input file 10 which includes specific information concerning the various modules of the design, in this example, pins of the chip. The description is written using a specific format, as further described below. However, a non-technical English-like language is used in creating the input file which obviates the necessity for familiarity with a specialized computer language.

The newly created input file 10 is fed into a Timing Shell Generator Program 20 which operates to produce an output file (Timing Shell) 30 including a code language description 32 (shown in FIG. 2) of the module (pin) parameters originally specified by the user in the input file, and a schematic 34 (shown in FIG. 2) of the box and pins chosen by the user to be monitored for timing violations during simulation. The output file is then compiled and linked with the simulation system 40, after which a simulation is run. The Timing Shell monitors the designated pins for timing violations in real time during the course of the simulation and relays various predefined messages to the user when a violation occurs.

As previously stated, the input file created by a user (designer) is written in a non-technical language, (hereinafter "timing vernacular language") using common terms to describe the timing constraints of the various modules of a design. A timing constraint is a set of data defining the logic state (high or low) of a particular terminal or i.e. pin, of an element, component or module included in a circuit being analyzed, relative to a selected reference. The phrase "description of timing constraints" will hereinafter be used to refer to the specific words and/or symbols used to enter the timing constraints into the input file. The term "functional module" will be used hereinafter to refer to any form of circuit device including elements, components or modules, etc. Although the example below is described in terms of specific words and symbols in the timing vernacular language, it should be understood that any combination thereof is simply illustrative of the general concept of the present method. Any means could be used to describe the timing parameters of the modules so long as the Timing Shell Generator Program is designed to recognize the language used in the original input description.

Referring now to FIG. 2 in the preferred embodiment, the input file comprises three user-designated parts: 1) the name of the chip to be described (Chip Name 12); 2) an optional generic message to be printed when timing violations are encountered during a simulation (Violation Message 14); and, 3) a list of all of the pins (terminal names) and their timing constraints (Timing Constraints 16).

By way of specific example, after the chip name and generic message are designated, a set of timing constraints for every pin of interest must be designated. In a preliminary step, the pin name is listed. In the present embodiment, the pin names are always in capital letters, whereas the words used in listing the constraints are in lower case, except for the first letter. Next, the user specifies whether the pin is a clock pin, and also whether it is an input, output or bi-direct signal pin.

After designating a pin as input, output or bi-direct, the user lists the timing constraints of the pin. In the present embodiment, the constraints for every pin are separated by a semicolon, and the last constraint is marked by a period. Multiple clock pins are allowed.

As described above, the specific timing vernacular language and format used for the pin descriptions for an input file are not essential features of the method of the present invention. It is only necessary to designate the timing constraints in a manner that the Timing Shell Generator Program can recognize, such that an appropriate output file can be generated.

After the user has generated a descriptive input file, the user feeds the object code of the Timing Shell Generator or Program with the file. In the present embodiment, the Timing Shell Generator Program comprises three general subcomponents: a lexical analyzer 22; a parser 24; and, a generator 26. The parser, with the help of the lexical analyzer, recognizes an expression designating the pin timing constraints, and the generator generates a Behavioral Simulation Language (BSL) file that enforces these constraints during simulation. Although the present embodiment generates a BSL file, it is important to note that the specific output file language is not an essential feature of the present method. Any language can be used for the output file as long as that language is supported by appropriate system software. The important feature of the present method is that an output file is generated by the Timing Shell Generator Program which is compatible with the software used in the simulation program such that the timing shell can monitor the designated pins during simulation.

The Timing Shell Generator Program also generates a file containing a schematic of the box and pins chosen by the user to be monitored for compliance with timing constraints during simulation. This schematic composes part of the output file which is linked to the simulation system, and can be viewed on-screen to ensure that appropriate parameters have been designated for each pin.

By way of further specific illustration of the method of the present invention, and the Timing Shell Generator Program in particular, the following is an example of a user's input for a chip, named "example chip", and the corresponding output generated by the Timing Shell Generator Program when the input is fed into the program. (Note that the input is in an example of the timing vernacular language, and the corresponding output is in Behavior Simulation Language which is one of the behavior simulation languages provided for under the present invention.):

```
Input:

chipname : example_chip;
CLOCK:      Clock; Input; Cycle time 30.30 ns; Setup max 1
            ns; Hold min 13 ns.
MHOLD:      Input; Setup min 5 ns relative to CLOCK rising
            edge; Hold min 6 ns.
Output:

entity EXAMPLE_CHIP;
port CLOCK :input logic;
port MHOLD :input logic;
process setup MHOLD();
   var i :integer
{
   while (TRUE) (
      monitor CLOCK until CLOCK = hi;
      if (simtime() - MHOLD @ last change < 50.00) then
         send_receive_msg(" Setup time violation. Pin(s):
         MHOLD", 36);
   }
}
process hold MHOLD();
   var temp_time :integer;
{
   while (TRUE) (
      monitor CLOCK until CLOCK = hi;
      temp_time = simtime();
      monitor MHOLD;
      temp_time = (simtime() - temp_time) MOD 302;
      if (temp_time < 60.00) then
         send_receive_msg(" Hold time violation. Pin(s)
         :MHOLD", 36);
   }
}
```

In this specific example, the output file is a BSL code file, compatible with the system software presently used for running a simulation. The BSL code file is operative to monitor the user-designated pins for timing violations during simulation. The language of the output file could be any language supported by the system software used in conjunction with running simulations.

As previously noted, the output file is compiled and linked to the simulation system, after which a simulation is run. In the specific example as described above, the BSL file is compiled and linked to an Event Driven Simulation Environment. During simulation, the Timing Shell monitors all designated pins for each event, and displays the appropriate predefined messages when timing violations are encountered. In the preferred embodiment, a window 52 (shown in FIG. 2) appears on-screen showing the type of violation, the simulation time at which it occurred, and the pin involved. There is given at this time the alternative options of continuing or quitting the simulation. In addition to alerting the user of timing violation by using a window, a list of all violations is generated in a separate file 54 (shown in FIG. 2) for future reference. In this manner, the window interface can be disabled, and the entire simulation run, uninterrupted, with all detected violations being effectively stored in reference file 54 for subsequent review.

Some examples of the types of timing constraints monitored by the Timing Shell in accordance with the method of the present invention, and various designations and functions of the Timing Shell, are as follows:

1. Setup and hold time violations relative to any rising or falling edge of another signal. Specific examples: "Setup max 4 ns"; "Hold min 5 ns relative to CLOCK falling edge." The default is the rising edge of the clock.

2. Relative assertion or deassertion of a signal. Specific examples: "Pin A asserted when Pin B and CLOCK is asserted"; "Pin A asserted 1 cycle before Pin B is deasserted"; "Pin A can be asserted while Pin B or Pin C are asserted"; "Pin A asserted for at least 8 cycles"; "Pin A is stable while Pin B is asserted and Pin C is deasserted."

3. Clock specifications. Specific examples: "Cycle time 30 nsec"; "50% duty-cycle." The "N% duty-cycle" refers to the clock duty cycle. This constraint should appear only in the set of constraints for the clock.

4. Specify if a signal is active high or active low. Specific example: "Pin A is active low." If this constraint is missing, the signal is considered active high.

5. Special properties. Specific example: "Preserve data at all inputs until Pin A is deasserted.

6. Insert special messages to be printed when any of the timing constraints of a pin is violated. Specific example: "Pin A: Message {Ignore violations on Pin A.}." A generic message is also chosen. The generic message is not included in any of the pin constraint lists, and represents the message to be shown to the user when a timing violation in any of the pins occurs. If a pin has a message assigned to it, then that message is preferred over the generic message.

Specific examples of the manner in which the Timing Shell functions during simulation to monitor the modules of a design are as follows:

Example 1: If pin A is described as asserted while B is deasserted, during simulation, the Timing Shell checks pins A and B at all times. If B is deasserted and A is not asserted, then an error message appears.

Example 2: If pin A is described as asserted relative to C rising edge while B is deasserted, then, during simulation, the Timing Shell checks pins A, B and C until C's rising edge is detected and B is deasserted. Pin A is then checked to see if it is asserted. If it is not, an error is signaled. If A is asserted, A and B are still checked until A is deasserted. If A was deasserted before B was asserted, then an error is signaled.

Example 3: If pin A is described as asserted for at least 8 cycles, then, during simulation, the Timing Shell checks pin A to see when it gets asserted. From that time, if A gets deasserted in less than 8 cycles, an error is signaled.

Example 4: If pin A is described as can be asserted while B is deasserted, then, during simulation, the Timing Shell checks pin A. If pin A gets asserted then the shell checks if B is deasserted. If B is not deasserted, then an error is signaled. The Timing Shell continues to monitor pins A and B until either A is deasserted (at which time return is made to the beginning of the algorithm) or B is asserted and A is still asserted. In the latter case, an error message is signaled, and return is made to the beginning of the algorithm.

Example 5: If Pin A is described as asserted when B is deasserted, then, during simulation, the Timing Shell checks pin B to see when it gets deasserted. Since there is no relative pin phrase, the rising edge of the clock is the default point, after which, if pin B is deasserted, then pin A is checked to see if it is asserted. In pin A is not asserted, an error message is signaled.

The Timing Shell Generator is currently being run on Sun-4 workstations under SunOS, and the current implementation supports an interface with the user based on "suntools." Once an input file description has been generated, the object code of the Timing Shell Generator is fed with this file, and the Timing Shell Generator automatically produces a BSL file implementing the timing constraints. The Timing Shell Generator also generates a file with the names of all of the pins and information for each of them. The BSL file is compiled and linked with the system, and an event driven simulation is run.

As described above, the method of the present invention provides a user with a truly unique capability to check any level of a design for relative timing violations. A significant advantage is provided by allowing a user to check for ranges of values for each module of a design, as opposed to being confined to simply monitoring predetermined specific constant values. This allows uncompromised flexibility in design capabilities and greatly reduces the need for the substantial applications support normally required to ensure a proper functional design.

Although the method of the present invention has been described in terms of a specific embodiment, it is important to note that alternative embodiments are contemplated. For example, as previously stated, any output file language can be used which is supported by the appropriate software for the system running the simulation. Additionally, the grammar and format used for describing a design at the input file stage could also be altered, as long as the Timing Shell Generator is designed to recognize the terms used in the description, and is operative to produce an appropriate output file enforcing the module timing constraints. Furthermore, the system environment in which the Timing Shell Generator operates can be any system with the requisite simulation or testing capabilities, and is not limited to a single hardware/software combination. Thus it is contemplated that other alternatives and modifications may become apparent to those skilled in the art after having read the above disclosure. It is, therefore, intended that the appended claims be interpreted as covering all such alterations and modifications as fall within the true spirit and scope of the invention.

What is claimed is:

1. A method for providing user-specified timing constraints to a simulator of system operation, between functional modules of a design for a system including a plurality of modules, each module having one or more terminals and its own individual operational parameters, the user-specified timing constraints being converted from a timing vernacular language to timing constraints in a behavioral simulation language that is compatible with the simulator, the method comprising the steps of:

creating an input file containing specifications in the timing vernacular language including a system name, one or more terminal names of the modules, and timing constraints associated with each of the terminal names; and converting the specifications in the timing vernacular language to specifications in the behavioral simulation language, using a timing shell generator means, including a lexical analyzer, a parser, and a generator;

the converted specifications in the behavioral simulation language being used to direct the simulator to monitor and report timing violations in accordance with said timing constraints.

2. The method of claim 1 and further comprising the use of said timing shell generator means to generate a file containing a schematic representation of said functional modules of said design.

3. The method of claim 1 wherein said behavioral simulation language is Behavioral Simulation Language.

4. The method of claim 1 wherein said timing violations are stored in a reference file for subsequent use.

\* \* \* \* \*